United States Patent [19]
Kohno et al.

[11] Patent Number: 5,548,215
[45] Date of Patent: Aug. 20, 1996

[54] MR IMAGING APPARATUS

[75] Inventors: Satoru Kohno; Naoto Iijima; Akihiro Ishikawa, all of Kyoto, Japan

[73] Assignee: Shimadzu Corporation, Kyoto, Japan

[21] Appl. No.: 299,119

[22] Filed: Sep. 2, 1994

[30] Foreign Application Priority Data

Sep. 30, 1993  [JP]  Japan ................. 5-269889

[51] Int. Cl.$^6$ ................. G01V 3/00; G01V 3/14
[52] U.S. Cl. ................. 324/309; 324/307
[58] Field of Search ................. 324/306, 307, 324/309, 314, 318, 322

[56] References Cited

U.S. PATENT DOCUMENTS

| | | |
|---|---|---|
| 4,649,345 | 3/1987 | Yoda et al. . |
| 4,684,891 | 8/1987 | Feinberg . |
| 5,184,073 | 2/1993 | Takeuchi et al. ................. 324/309 |
| 5,422,576 | 6/1995 | Kao et al. ................. 324/309 |

FOREIGN PATENT DOCUMENTS

| | | |
|---|---|---|
| 0572074A1 | 12/1993 | European Pat. Off. . |
| 0577188A1 | 1/1994 | European Pat. Off. . |
| 0600355A1 | 6/1994 | European Pat. Off. . |
| WO93/01509 | 1/1993 | WIPO . |

OTHER PUBLICATIONS

"Cartesian Echo Planar Hybrid Scanning with Two to Eight Echoes," 8197 IEEE Transactions on Medical Imaging 10 (1991) Mar., No. 1, pp. 1–10, G. Kashmar et al.

"Fast MRI by Creating Multiple Spin Echoes in a CPMG Sequence," 8306 Magnetic Resonance in Medicine 30 (1993) Aug., No. 2, pp. 251–254, Koichi Oshio et al.

*Primary Examiner*—Sandra L. O'Shea
*Assistant Examiner*—Mark Haynes
*Attorney, Agent, or Firm*—Nikaido, Marmelstein, Murray & Oram LLP

[57] ABSTRACT

An MR imaging apparatus using NMR phenomenon includes a main magnet for generating a uniform static magnetic field in an imaging space, a first to a third gradient field coils, an RF coil for emitting an excitation RF pulse and a plurality of refocus RF pulses and detecting echo signals, an RF emitter for modulating and emitting the excitation RF pulse and refocus RF pulses with predetermined timing through the RF coil, and a slice-selecting gradient field pulse generator. A phase-encoding gradient field pules generator and a reading gradient field pulse generator are provided, along with a data collector for detecting, with a predetermined frequency (reference frequency), the echo signals detected by the RF coil, and collecting data therefrom. A phase detector determines phase differences of echo peaks in the echo signals with respect to the reference frequency, respectively. A rotating device rotates the data collected from the echo signals based on the phase differences to connect phases of the echo signals to be continuous, and a data processor is provided for reconstructing a sectional image based on the rotated data.

12 Claims, 5 Drawing Sheets

MR IMAGING APPARATUS

BACKGROUND OF THE INVENTION

1. Field of the Invention

This invention relates to MR imaging apparatus using NMR (nuclear magnetic resonance), and more particularly to an MR imaging apparatus which acquires images by a technique called hybrid scan.

2. Description of the Related Art

According to a basic method, a conventional MR imaging apparatus executes a pulse sequence repeatedly. In the pulse sequence, one echo signal (primary echo) is generated by irradiating an examinee with one excitation RF (Radio Frequency) pulse (also called 90° pulse since it rotates the spin phase of protons 90°) and then one refocus RF pulse (also called 180° pulse since it rotates the spin phase of protons 180°). Subsequently, the pulse sequence is repeated with varied phase encoding amounts. Data acquired from the echo signal generated in one pulse sequence are arranged on one line in a raw data space (also called k space). In order to obtain a raw data space having 256 lines, for example, the pulse sequence must be repeated 256 times with different phase encoding amounts according to this basic method. Thus, data collection requires a time-consuming operation.

In view of the above situation, what is known as single-shot scan has been developed in which an examinee is irradiated with one excitation RF pulse (called a single shot), and data for all the lines in the raw data space are acquired with this single shot. The single-shot method includes a fast spin echo method and EPI (Echo Planar Imaging). The fast spin echo method uses a pulse sequence called RARE (Rapid Acquisition with Relaxation Enhancement) in which one excitation RF pulse is followed by a plurality of (e.g. 256) refocus RF pulses to generate echo signals which are subjected to different phase encoding. The echo planar imaging uses a technique called gradient switching in which one excitation pulse is followed by alternate reversals of the polarity of gradient field pulses effected plural times (e.g. 256 times) to generate a plurality of echo signals which are subjected to different phase encoding. However, the plurality of echo signals generated by these methods attenuate with time, and the later echo signal has the less strength. A sectional image of poor quality is reconstructed by arranging the data from these echo signals on a plurality of lines in a raw data space.

Then, a combination of the above basic method and single-shot scan method, known as hybrid scan method, has been developed. This hybrid scan method will be described, taking a combination of the basic method and fast spin echo method for example. In this method, four echo signals are successively generated by irradiating an examinee with one excitation RF pulse and then four refocus RF pulses. Each of these echo signals is subjected to four different types of phase encoding, to collect data for four of the 256 lines in the raw data space at a time. This pulse sequence is repeated 64 times to acquire data for all the lines in the raw data space.

Use of this hybrid scan method realizes a reduction in the number of times the pulse sequence is repeated in order to acquire necessary data for one raw data space without a substantial deterioration in image quality. Thus, an image pickup operation may be expedited.

However, the hybrid scan method has the following drawbacks.

Particularly in the hybrid scan method combining the basic method and fast spin echo method, i.e. where a plurality of refocus RF pulses are used to acquire a plurality of echo signals, and where CPFH (Carr-Purcell-Freeman-Hill) (also called modified CP) pulse sequence is used which alternately switches the phase polarity of the refocus RF pulses, the spin phase of protons is rotated 90° by one excitation RF pulse, thereafter the spin phase of protons is rotated 180° by the first refocus RF pulse, and further the spin phase of protons is rotated −180° by the second refocus RF pulse. In this way, the phase polarity is switched a predetermined number of times, alternately for the refocus RF pulses odd-numbered and even-numbered in order. Each of the echo signals thereby generated is subjected to different, continuous phase encoding. The data derived from the echo signals are arranged along adjacent lines, i.e. lines with continuous phase encode amounts, in the raw data space. An image is reconstructed by effecting a Fourier transform on this raw data space. The phase encode amounts of the adjacent lines which should be continuous are discontinuous because of the phase difference (180°) between the echo signals. A blur which is one type of artifacts occurs to the image reconstructed by a Fourier transform of the raw data space having such discontinuous phase encode amounts.

Where refocus RF pulses are used likewise and CPMG (Carr-Purcell-Meiboom-Gill) pulse sequence is used in which the refocus RF pulses are emitted in a phase 90° different from that of the excitation RF pulse, no phase difference occurs between the echo signals since the refocus RF pulses have no phase difference therebetween. Consequently, a blur does not occur to one raw data space, i.e. one slice image reconstructed. However, when data are collected for a plurality of raw data spaces (i.e. for multiple slices), a phase difference occurs between adjacent lines in the raw data spaces for those of the slices other than the central slice, i.e. peripheral slices, for the following reason.

For obtaining multiple slices, it is usual practice to apply slice-selecting gradient field pulses along a direction of thickness of the slices. The slice-selecting gradient fields pulse are applied to have zero strength for the central one of the slices. A carrier frequency of the excitation RF pulse and refocus RF pulses is deviated by an amount corresponding to a slice location from a frequency for selecting the central slice for which the gradient field pulse has zero strength. While a plurality of slices are selected in this way, the carrier frequency of the excitation RF pulse and refocus RF pulses is different between the central slice and peripheral slices. However, the echo signals collected from the plurality of slices are detected as data by a phase detection using a reference frequency which is the same as the carrier frequency for selecting and exciting the central slice. Since the carrier frequency used in emitting the RF pulses to the peripheral slices is different from the reference frequency for detecting the echo signals generated by the RF pulses, the phase encode amounts arranged along the lines in the raw data spaces for the peripheral slices shift by phase differences corresponding to the above frequency differences. That is, phase differences occur to the peripheral slices since a rotatory coordinate system of the carrier frequency rotates relative to a rotatory coordinate system of the reference frequency which is an observation system. These phase differences result in blurs occurring to reconstructed images as noted above.

A hybrid scan method combining the basic method and echo planar method has the following drawback.

In this case, echo signals are generated by polarity reversal of the gradient field pulses, and differences in echo peak generating time result from differences in timing of polarity reversal of the gradient field pulses and non-uniformity of the static magnetic field. That is, phase differences occur among the echo signals. This also causes a blurred image.

It is conceivable to avoid the phase differences among the echo signals noted above by varying timing of refocus RF pulse emission, thereby controlling the peak generating time for each echo signal. However, this would require a control system of an RF emitter and the like to effect high-speed controls of the frequencies and emission timing of the refocus RF pulses, thereby imposing a heavy load on the control system. This measure is impractical in that the high-speed controls would tend to involve insufficient precision and require stability of the control system.

SUMMARY OF THE INVENTION

The object of this invention is to provide an MR imaging apparatus capable of amending the phase differences among echo signals, when images are acquired by a hybrid scan method, to suppress image blurring without the problem of a heavy load imposed on a control system.

The above object is fulfilled, according to this invention, by an MR imaging apparatus using NMR phenomenon, comprising:

a main magnet for generating a uniform static magnetic field in an imaging space;

a first, a second and a third gradient field coils for generating three types of gradient field pulses (i.e. slice-selecting gradient field pulses, phase-encoding gradient field pulses and reading gradient field pulses) with magnetic strengths varying in three orthogonal directions in the imaging space;

a RF coil for emitting an excitation RF pulse and a plurality of refocus RF pulses and detecting echo signals;

a RF emitter for modulating, with a predetermined carrier frequency, and successively emitting the excitation RF pulse and refocus RF pulses with predetermined timing through the RF coil;

a slice-selecting gradient field pulse generator for generating the slice-selecting gradient field pulses through the first gradient field coil for selecting slice planes, in timed relationship with the excitation RF pulse and refocus RF pulses;

a phase-encoding gradient field pulse generator for generating the phase-encoding gradient field pulses through the second gradient field coil in timed relationship with the echo signals, the phase-encoding gradient field pulses being varied for the respective echo signals;

a reading gradient field pulse generator for generating the reading gradient field pulses through the third gradient field coil in timed relationship with the echo signals;

a data collector for detecting, with a predetermined frequency (reference frequency), the echo signals detected by the RF coil, and collecting data therefrom;

a phase detector for determining phase differences of echo peaks in the echo signals with respect to the reference frequency, respectively;

a rotating device for rotating the data collected from the echo signals based on the phase differences to connect phases of the echo signals to be continuous; and a data processor for reconstructing a sectional image based on the data rotated.

The main magnet forms a static magnetic field in an imaging space, and then the first gradient field coil applies a slice-selecting gradient field pulse to the imaging space. As a result, different resonance frequencies occur in different positions in a direction of slice thickness. Then, the RF emitter successively emits one excitation RF pulse and a plurality of refocus RF pulses. The carrier frequency of the RF pulses is one for exciting protons in a desired slice position. The second gradient field coil effects different encoding of the respective echo signals generated by these RF pulses. The third gradient field coil applies reading gradient field pulses in timed relationship with generation of the echo signals. The data collector collects data by detecting the echo signals with a predetermined frequency (reference frequency). Since the echo signals are modulated with the predetermined carrier frequency, phase differences due to the two different frequencies occur among the echo signals. The echo signals have phase differences due also to the method by which the RF emitter emits the refocus RF pulses. The phase detector detects the phase differences among the echo signals by determining phase differences of echo peaks in the respective echo signals with respect to the reference frequency. The rotating device rotates the data collected from the echo signals based on the phase differences. As a result of this rotation, phases of the echo signals are connected to be continuous. The data processor reconstructs a sectional image from the data rotated, i.e. from a raw data space having continuous phase encoding amounts.

In this way, a sectional image is picked up at increased speed by the hybrid scan method, while detecting and amending the phase differences among the echo signals. The phases on the respective lines in the raw data space are connected to be continuous, to suppress blurring of the image reconstructed from the raw data space.

It is preferred that, in the apparatus according to this invention, the RF emitter is operable to emit the refocus RF pulses while alternately switching a phase polarity thereof.

The RF emitter emits the excitation RF pulse to rotate the spin phase of protons by a predetermined angle, and then emits the plurality of refocus RF pulses to rotate the spin phase of protons by a predetermined angle, thereby to generate a plurality of echo signals. Generally, the excitation RF pulse is a 90° pulse while the refocus RF pulses are 180° pulses. The spin phase of protons is rotated through these angles. These angles are adjusted by controlling emission timing and field strength of the pulses. The refocus RF pulses cannot be made 180° pulses accurately because of emission mistiming, imprecision in the field strength or the like. The 180° pulses could be 175° pulses, for example. When the spin phase of protons is rotated continually by a plurality of imperfect, 175° refocus RF pulses, phase errors of 5° will accumulate. With four 180° refocus RF pulses, for example, a phase of 180°×4=720° will result from an initial phase. However, the four imperfect pulses will make a phase of 175°×4=700°, resulting in an accumulated phase error of 20° (5°×4 times). Where the refocus RF pulses are applied with phase polarity switched alternately, e.g. where 180° pulses and −180° pulses are applied alternately, the first refocus RF pulse rotates the spin angle of protons 175°, and the second refocus RF pulse rotates the spin angle −175°, which makes 0° accumulated phase error. Thus, with one excitation RF pulse and a plurality of refocus RF pulses applied successively, echo signals may be generated over a long period of time.

In the apparatus according to this invention, the phase detector, preferably, is operable to derive the phase differences from;

$$\phi = (\omega_C - \omega_R)k \cdot Tes + (1 + (-1)^k)\pi/2 \text{(rad)}$$

where k is a positive integer representing an echo signal number in order of emission, $\omega_C$ is the carrier frequency, $\omega_R$ is the reference frequency, and Tes is an echo interval.

The phase detector derives a phase difference of each echo signal due to the difference between the carrier frequency $\omega_C$ and reference frequency $\omega_R$ from the echo number k and echo interval Tes (the first term of the above equation). Where the RF emitter emits the refocus RF pulses with the phase polarity switched alternately, a 180° phase difference occurs between the echo signal odd-numbered in order and the echo signal even-numbered in order. This phase difference is derived from the second term of the above equation. The sum of the first and second terms provides a phase difference of each echo signal generated.

Thus, image blurring in the hybrid scan method using CPFH pulse sequence may be suppressed by deriving the phase difference of each echo signal from the above equation.

In the apparatus according to this invention, the RF emitter may be operable to emit the refocus RF pulses 90° out of phase with the excitation RF pulse without switching a phase polarity thereof.

Then, the apparatus may be applicable also to the hybrid scan method using CPMG pulse trains in the pulse sequence.

In the apparatus according to this invention, the phase detector, preferably, is operable to derive the phase differences from;

$$\phi=(\omega_C-\omega_R)k \cdot Tes\,(\text{rad})$$

where k is a positive integer representing an echo signal number in order of emission, $\omega_C$ is the carrier frequency, $\omega_R$ is the reference frequency, and Tes is an echo interval.

The phase detector derives a phase difference of each echo signal due to the difference between the carrier frequency $\omega_C$ and reference frequency $\omega_R$ from the echo number k and echo interval Tes.

Thus, image blurring in the hybrid scan method using CPMG pulse sequence may be suppressed by deriving the phase difference of each echo signal from the above equation.

In the apparatus according to this invention, the phase detector, preferably, is operable to stop the phase-encoding gradient field pulse generator prior to photographing of the sectional image, thereafter to execute a phase difference measuring pulse sequence corresponding to a photographing pulse sequence, and to measure the phase differences of the echo peaks in the echo signals with respect to the reference frequency, respectively..

The phase-encoding gradient field pulse emitter is stopped prior to photographing of the sectional image. Then, a phase difference measuring pulse sequence corresponding to a photographing pulse sequence is executed (using CPFH or CPMG pulse trains). The magnetic fields are not disturbed by the phase-encoding reference frequency pulses, and therefore strong echo signals are generated for measurement. That is, echo signals having distinct peaks are obtained. The echo peaks in the respective echo signals are determined, and phase differences with respect to the reference frequency are determined for the respective echo signals from these echo peaks.

The phase differences determined by measurement as described above include no computational error due to deviations from design values of the carrier frequency and reference frequency. Thus, accurate phase differences are obtained.

Preferably, the RF emitter is operable to control emission timing of an "n"th refocus RF pulse ("n" being a positive integer) to establish;

$$\{2(n-1)+1\}\tau$$

where emission of the excitation RF pulse is regarded as time origin, and $\tau$ is a point of time at which a first one of the refocus RF pulses is emitted.

Where the refocus RF pulses are emitted with the above timing, the periods of time to generation of the respective echo signals correspond to the period of time to generation of the first echo signal multiplied by integers. Thus, spurious echo signals due to imperfection of the refocus RF pulses are generated at the same points of time as the proper echo signals to suppress phase shift. In this way, the spurious echo signals may also be used as stimulated echo signals for image formation.

Preferably, the phase-encoding gradient field pulse generator is operable to generate rewinding pulses symmetric to the phase-encoding gradient field pulses about centers of the echo signals, respectively, and having the same strength and pulse width as and an opposite polarity to the phase-encoding gradient field pulses.

The rewinding pulses applied have the same strength and pulse width as and the opposite polarity to the phase-encoding gradient field pulses with respect to the centers of the echo signals. Consequently, the echo signals have the same initial condition to receive separate and independent phase encoding without the influences of immediately preceding phase encoding. This suppresses phase shift to diminish the influences of immediately preceding phase encoding on a reconstructed image.

It is further preferred that, in the apparatus according to this invention, the data collector is operable to collect the data by detecting the echo signals with a predetermined amount offset from the reference frequency.

The raw data space is a space formed by phase encoding and frequency encoding. The data in the position of zero frequency encoding corresponds to the central position of a reconstructed image. When the reference frequency used by the data collector in the signal detection is offset by a predetermined amount, the data in the raw data space corresponding to the central position of the reconstructed image shifts by the predetermined amount. The reconstructed image also moves accordingly. Thus, even when the position of an examinee in the MR imaging apparatus is not a desired position, the reconstructed image may be moved by offsetting the reference frequency by a predetermined amount without moving the examinee.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DESCRIPTION OF THE PREFERRED EMBODIMENTS

Preferred embodiments of this invention will be described in detail hereinafter with reference to the drawings.

First Embodiment

Figure 1:
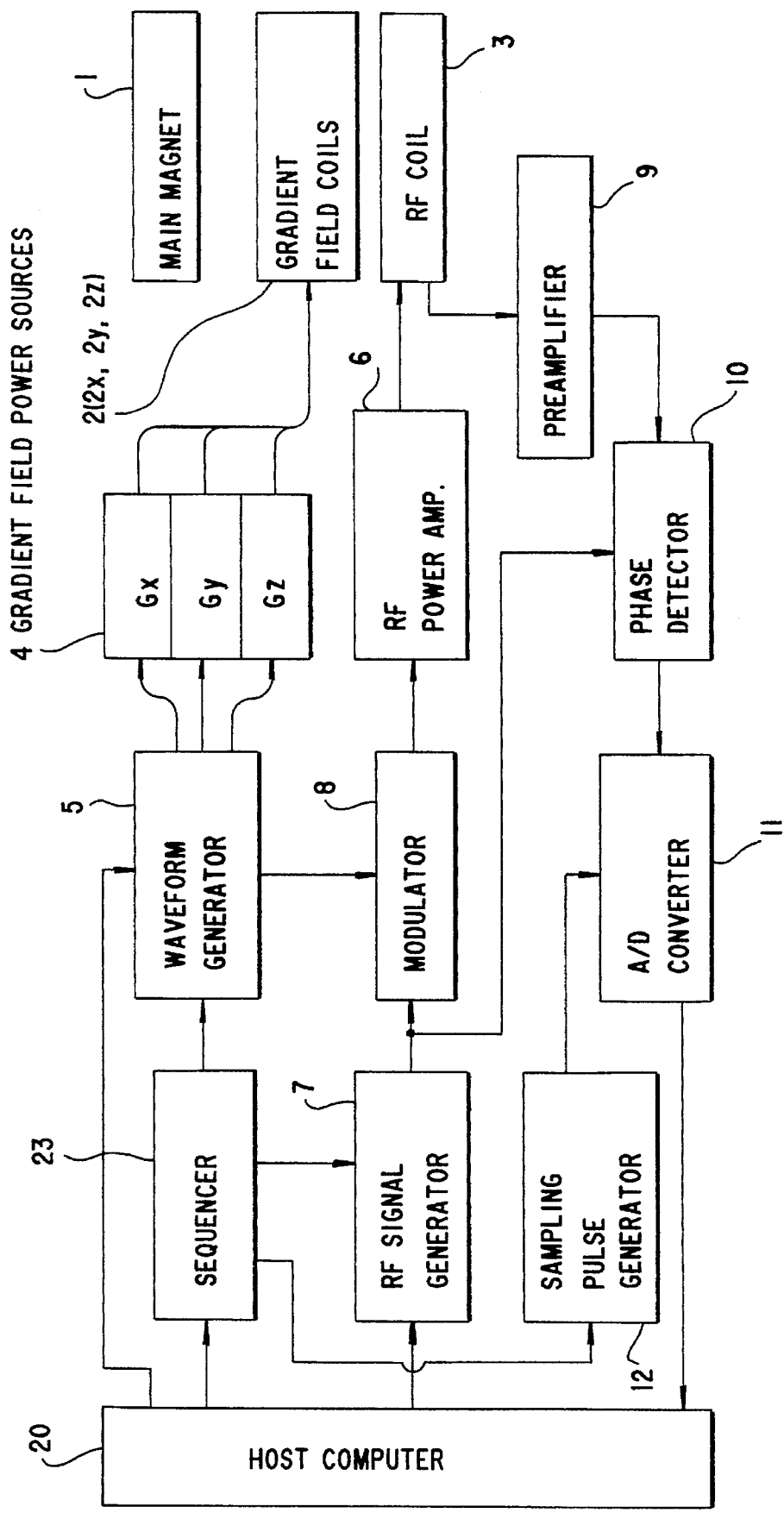
FIG. 1 is a block diagram of an MR imaging apparatus according to this invention.

The MR imaging apparatus shown in FIG. 1 will be described first. The apparatus includes a main magnet 1 for forming a static magnetic field, and three gradient field coils 2 (i.e. 2x, 2y and 2z) for superimposing gradient magnetic fields on the static magnetic field. The three gradient field coils 2x, 2y and 2z superimpose, on the uniform static field formed by the main magnet 1, pulses for three gradient fields Gx, Gy and Gz (i.e. a slice-selecting gradient field pulse, a phase-encoding gradient field pulse, and a reading gradient field pulse) each having a field strength varying in three orthogonal directions (X, Y and Z). An examinee (patient) is placed in a space where the static and gradient fields are formed, with a RF coil (radiofrequency coil) 3 attached to the examinee.

Gradient field power sources 4 are connected to the gradient field coils 2 to supply power for generating the gradient fields Gx, Gy and Gz. The gradient field power sources 4 receive waveform signals from a waveform generator 5 to control waveforms of the gradient fields Gx, Gy and Gz. The RF coil 3 receives a RF signal from a RF power amplifier 6 to irradiate the examinee with the RF signal. This RF signal results from an amplitude modulation effected by a modulator 8, according to a waveform received from the waveform generator 5, on a RF signal of a predetermined carrier frequency $\omega_C$ generated by a RF signal generator 7.

The RF coil 3 receives NMR signals generated in the examinee, and transmits these signals through a preamplifier 9 to a phase detector 10. The phase detector 10 detects phases of the signals received, using the RF signal from the RF signal generator 7 as a reference frequency $\omega_R$. Results of the detection are outputted to an analog-to-digital (A/D) converter 11. The A/D converter 11 also receives sampling pulses from a sampling pulse generator 12 for use in converting the detection results into digital data. The digital data are given to a host computer 20.

The host computer 20 processes the data to reconstruct an image, and determines timing of an overall sequence through a sequencer 23. That is, the sequencer 23, under the control of the host computer 20, transmits timing signals to the waveform generator 5, RF signal generator 7 and sampling pulse generator 12 to determine timing of waveform signal output from the waveform generator 5, timing of RF signal generation by the RF signal generator 7, and timing of sampling pulse generation by the sampling pulse generator 12. Further, the host computer 20 transmits waveform information to the waveform generator 5 to control the waveform, strength and the like of the pulses for the gradient fields Gx, Gy and Gz, and to determine an envelope of the RF signal emitted from the RF coil 3 to the examinee. The host computer 51 also transmits a signal to the RF signal generator 7 to control carrier frequency $\omega_C$ of the RF signal. Thus, the host computer 20 controls the overall pulse sequence based on an imaging sequence of the hybrid scan method or the like, and detects and amends phase differences of the echo siganls generated.

Figure 2:
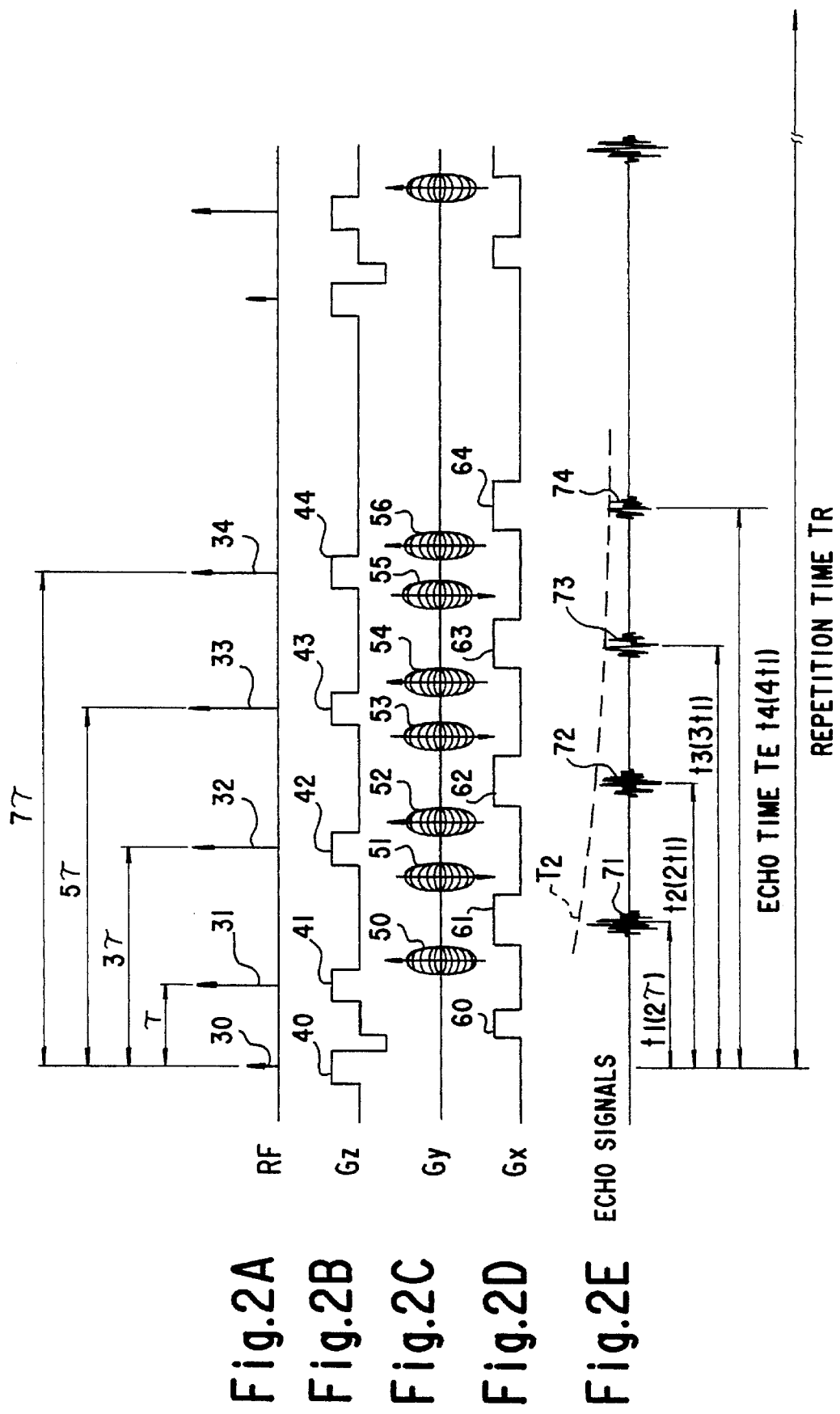
FIG. 2 is a time chart showing a pulse sequence using CPFH pulse trains.

The above MR imaging apparatus, under control of the computer 20 and sequencer 23, executes a pulse sequence as shown in FIG. 2. The pulse sequence shown in FIG. 2 is based on a multiple slice hybrid scan method using a fast spin echo method having CPFH (also called modified CP) pulse trains.

First, one 90° pulse (excitation RF pulse) 30 is applied, and simultaneously a slice-selecting gradient field pulse 40 is applied through the gradient field coil 2z. Then, one 180° pulse (refocus RF pulse) 31 is applied upon lapse of time $\tau$ from application of the 90° pulse 30, and a $-180°$ pulse (refocus RF pulse) 32 upon lapse of time $2\tau$ from the 180° pulse 31. In this way, four 180° pulses 31, 32, 33 and 34 are applied successively while switching the phase polarity between positive and negative, along with slice-selecting field pulses 41, 42, 43 and 44.

In this case, a first echo signal 71 is generated around a point of time delayed from the refocus RF pulse 31 by a period of time corresponding to the period of time $\tau$ between the excitation RF pulse (90° pulse) 30 and refocus RF pulse (180° pulse) 31. Here, the time taken from the excitation RF pulse (90° pulse) 30 to the echo center (echo delay time $2\tau$) is regarded as time t1.

Assuming that the echo delay time from the excitation RF pulse (90° pulse) 30 to the echo center is t1 as noted above, the first refocus RF pulse 31 is set to $t=(1/2)t1=\tau$, where the excitation RF pulse (90° pulse) 30 is regarded as time origin (t=0). Thus, emission time of an "n"th refocus RF pulse ("n" being a positive integer) is set to $\{2(n-1)+1\}\tau$. That is, by setting emission times of refocus RF pulses 32, 33 and 34 to $t=(3/2)t1=3\tau$, $t=(5/2)t1=5\tau$, and $t=(7/2)t1=7\tau$, respectively, echo signals are generated at points of time t1, t2, t3 and t4, respectively. Thus, the periods of time t2, t3 and t4 from the excitation RF pulse 30 to generation of the second and subsequent echo signals correspond to the period of time from the excitation RF pulse 30 to generation of the first echo signal multiplied by integers, i.e. $t2=2t1$, $t3=3t1$, and $t4=4t1$.

By controlling emission timing of the refocus RF pulses as above, spurious echo signals due to imperfection of the refocus RF pulses are generated at the same points of time as the proper echo signals to suppress phase shift. In this way, the spurious echo signals may also be used as stimulated echo signals for image formation.

A dephasing gradient pulse 60 (for disarraying the spin phase of protons) is applied through the gradient field coil 2x before the first 180° pulse 31. After the respective refocus RF pulses 31, 32, 33 and 34, reading gradient field pulses 61, 62, 63 and 64 are applied for frequency encoding, to align the spin phase of protons and generate the echo signals.

Further, phase-encoding gradient field pulses 50, 52, 54 and 56 are applied through the gradient field coil 2y after the respective refocus RF pulses 31, 32, 33 and 34 and before generation of the echo signals 71, 72, 73 and 74, to subject these echo signals to phase encoding of different amounts. Pulses 51, 53 and 55 applied through the gradient field coil 2y after generation of the echo signals 71, 72, 73 and 74 serve for rewinding purposes. The rewinding pulses 51, 53 and 55 have the same strength and pulse width as and the opposite polarity to the phase-encoding gradient field pulses 50, 52 and 54 with respect to the centers of the echo signals 71, 72 and 73. Consequently, the echo signals 72, 73 and 74 have the same initial condition to receive separate and independent phase encoding without the influences of immediately preceding phase encoding. No rewinding pulse is applied after generation of the echo signal 74. This is because the dephasing gradient pulse 60 noted above disarrays the spin phase of protons at the beginning of a next pulse sequence, and at the same time eliminates the influences of immediately preceding phase encoding.

Figure 3:
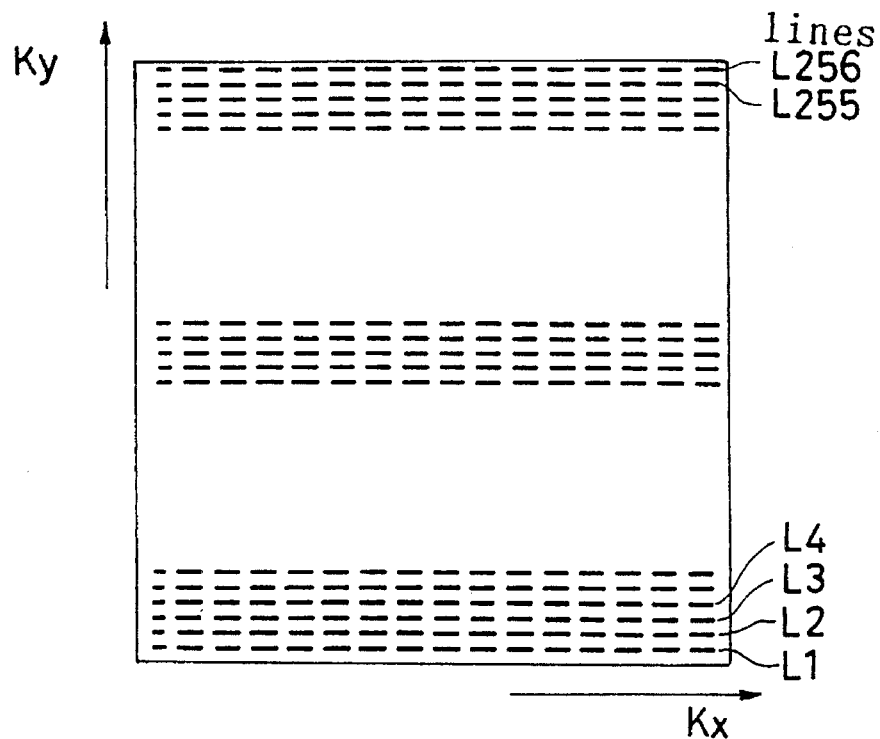
FIG. 3 is a view showing a raw data space for arranging data derived from echo signals generated.

Through this pulse sequence, the first echo signal 71 through fourth echo signal 74 are generated. These echo signals provide data for each line in a horizontal direction (i.e. direction Kx) in a raw data space as shown in FIG. 3. The data on the respective lines are arranged vertically (i.e. direction Ky) in the raw data space. In this example, the data derived from the first echo signal 71 are arranged on a first line L1, the data derived from the second echo signal 72 on a second line L2, the data derived from the third echo signal 73 on a third line L3, and the data derived from the fourth echo signal 74 on a fourth line L4. It is to be noted that the first to fourth echo signals 71–74 have a signal strength diminishing toward the later signals according to a T2 relaxation curve as shown in a dotted line in FIG. 2.

To acquire clinically useful T2 enhanced signals, the above pulse sequence is repeated with a repetition time TR set to 2 to 3 seconds. Since echo time TE to generation of the fourth echo signal 74 may be set to about 90 milliseconds, the subsequent waiting time (1.91 to 2.91 seconds) may be utilized to collect data likewise from numerous other slices along the slice-selecting gradient field. That is, after generation of the fourth echo signal 74, the host computer 20 instructs the RF signal generator 7 to change the carrier frequency $\omega_C$ of the RF signals in the preceding pulse sequence, i.e. to select and excite a different slice plane, for carrying out a similar pulse sequence. In this way, four pulse sequences are executed with different encode amounts. After the pulse sequences are executed for a desired number of slices, the operation returns to the processing for the first slice plane. Then, data are collected for arrangement, for example, on the fifth to eighth lines by further changing the phase encode amount effected during the processing for the first slice plane. Such a pulse sequence is repeated while changing the phase encode amount. Assuming that 256 lines are required as shown in FIG. 3, the pulse sequence is repeated 64 (=256/4) times for one slice plane.

Figure 4A:
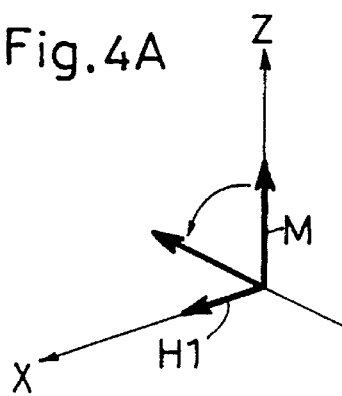
FIGS. 4A through 4C are views schematically showing behaviors of a magnetization vector in a central slice.
Figure 4B:
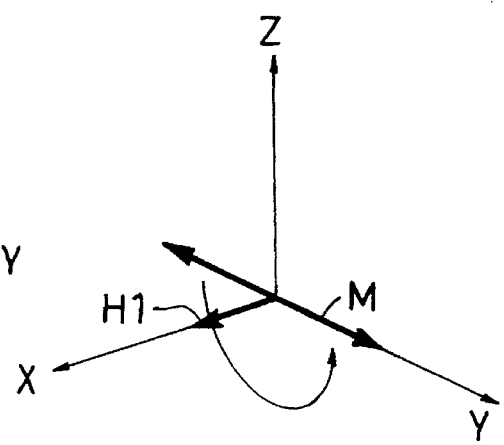
Figure 4C:
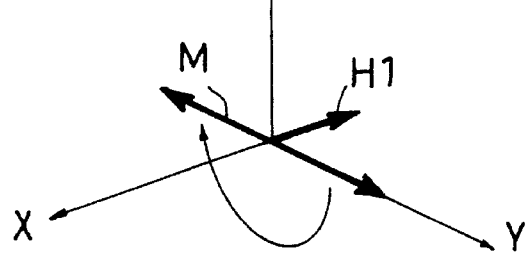

Consideration is made now as to the behaviour of magnetization vector M in time of application of the 90° pulse 30 and 180° pulses 31, 32, 33 and 34 in each pulse sequence. In the case of a central slice among a plurality of slices, i.e. $\omega_C=\omega_R$, the vector M behaves as shown in FIGS. 4A through 4C. Here, $\omega_C$ is the carrier frequency of the excitation RF pulse 30, i.e. the frequency of the RF signal transmitted from the RF signal generator 7 to the modulator 8. $\omega_R$ is the frequency of the signal applied as a reference signal from the RF signal generator 7 to the phase detector 10. When the 90° pulse 30 is applied, a field H1 thereby formed extends in direction X. Thus, as shown in FIG. 4A, the magnetization vector M extending in direction Z tilts 90° to extend in direction (–)Y. Subsequently, when the phase is disarrayed with lapse of time, the 180° pulse 31 is applied to form field H1 extending in direction X. Then, as shown in FIG. 4B, the magnetization vector M is turned 180° to extend in direction (+)Y, to generate the first echo signal 71. After a further lapse of time, the 180° pulse 32 of reversed polarity is applied to form a field H1 extending in direction (–)X. Then, as shown in FIG. 4C, the magnetization vector M is turned to extend in direction (–)Y again, to generate the second echo signal 72. Thus, CPFH pulse train, in principle, produces a 180° phase difference between the echo signal 71 odd-numbered in order and the echo signal 72 even-numbered in order.

Figure 5A:
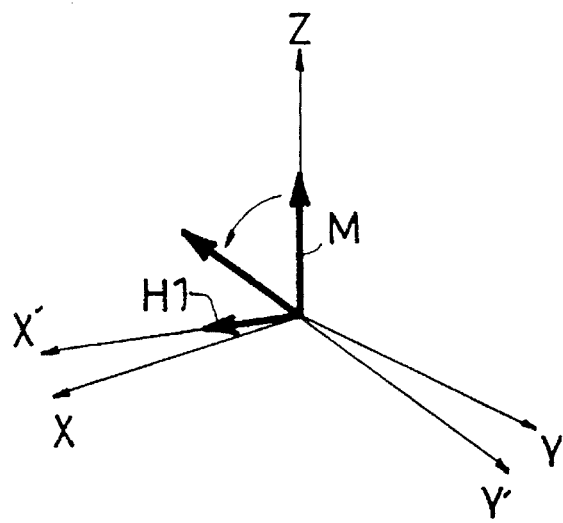
FIGS. 5A through 5C are views schematically showing behaviors of a magnetization vector in a peripheral slice.
Figure 5B:
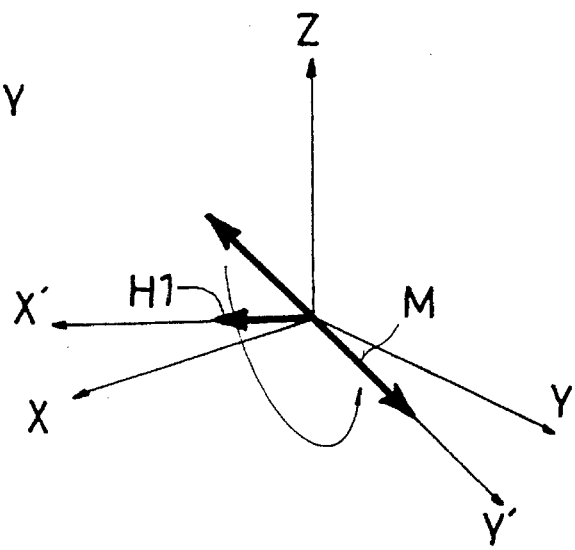
Figure 5C:
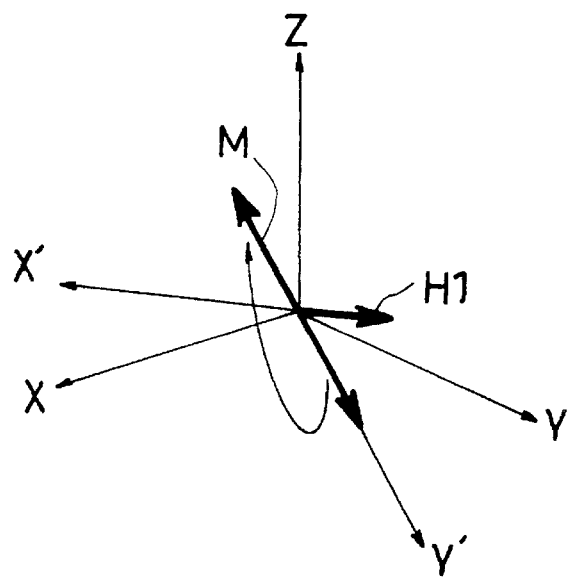

In the case of a peripheral slice spaced from the central slice, i.e. $\omega_C \neq \omega_R$, the vector M behaves as shown in FIGS. 5A through 5C. Here, Z-X-Y coordinate axes represent a rotatory coordinate system based on the reference frequency $\omega_R$, while Z-X'-Y' coordinate axes represent a rotatory coordinate system based on the carrier frequency $\omega_C$. The farther away the peripheral slice is from the central slice (with an increasing difference between $\omega_C$ and $\omega_R$), the greater is the phase shift between X and X' and between Y and Y'. The magnetization vector M tilts to extend along the axes of Z-X'-Y' coordinate system based on the carrier frequency $\omega_C$. When the first 90° pulse 30 is applied, a field H1 thereby formed extends in direction X'. Thus, as shown in FIG. 5A, the magnetization vector M extending in direction Z tilts to extend in direction (–)Y'. Subsequently, when the 180° pulse 31 is applied, a field H1 is formed to extend in direction X'. Consequently, as shown in FIG. 5B, the magnetization vector M is turned to extend in direction (+)Y', to generate the first echo signal 70. After a further lapse of time, the 180° pulse 32 of reversed polarity is applied to form a field H1 extending in direction (–)X'. Then, as shown in FIG. 5C, the magnetization vector M extends in direction (–)Y' again, to generate the second echo signal 72. Thus, as seen from the coordinate system based on the reference frequency $\omega_R$, which is an observation system, a phase difference occurs with each echo signal according to the difference from the carrier frequency $\omega_C$.

When the data obtained by the hybrid scan method based on such CPFH pulse trains are arranged along lines as shown in FIG. 3, the phase encode amounts are discontinuous among these lines, i.e. phase errors are produced. A blurred image will be reconstructed if such data are subjected as they are to a two-dimensional Fourier transform. The phase difference is amended for each slice and each echo signal as set forth hereunder.

A phase difference $\phi$ of each echo signal is expressed by the following equation (1):

$$\phi = (\omega_C - \omega_R)k \cdot Tes + \frac{1+(-1)^k}{2} \pi (\text{rad}) \quad (1)$$

where k: echo number (1, 2, 3, . . . ; positive integer);

$\omega_C$: carrier frequency;

$\omega_R$: reference frequency; and

Tes: echo interval.

A phase difference of each echo signal based on the carrier frequency $\omega_C$ and reference frequency $\omega_R$ is derived from the first term of this equation (1). The second term gives a 180° phase difference resulting from the refocus RF pulses emitted with the phase polarity switched alternately.

The computer 20 determines phase difference $\phi$ from equation (1), and effects a rotational phase amendment for each echo signal by computing a reverse rotation matrix expressed by the following equation (2) for the data collected from each echo signal:

$$\begin{bmatrix} \cos\phi & \sin\phi \\ -\sin\phi & \cos\phi \end{bmatrix} \quad (2)$$

The above process provides a continuous phase for the echo signals forming the data on the respective lines in each raw data space for a central slice or a peripheral slice spaced from the central slice. As a result, the problem of blurring reconstructed images is eliminated.

This embodiment has been described, exemplifying the hybrid scan method based on CPFH (also called modified CP) pulse trains. However, this invention is applicable also to a hybrid scan method based on CPMC pulse trains, which emits refocus RF pulses without alternately switching the phase polarity.

In the latter case, phase difference φ of each echo signal may be derived from the following equation (3) instead of the above equation (1). The same symbols as in equation (1) are used. A phase difference of each echo signal based on the carrier frequency $\omega_C$ and reference frequency $\omega_R$ is derived from the first term of this equation (3).

$$\phi=(\omega_C-\omega_R)k\cdot Tes\text{(rad)} \quad (3)$$

Second Embodiment

Figure 6:
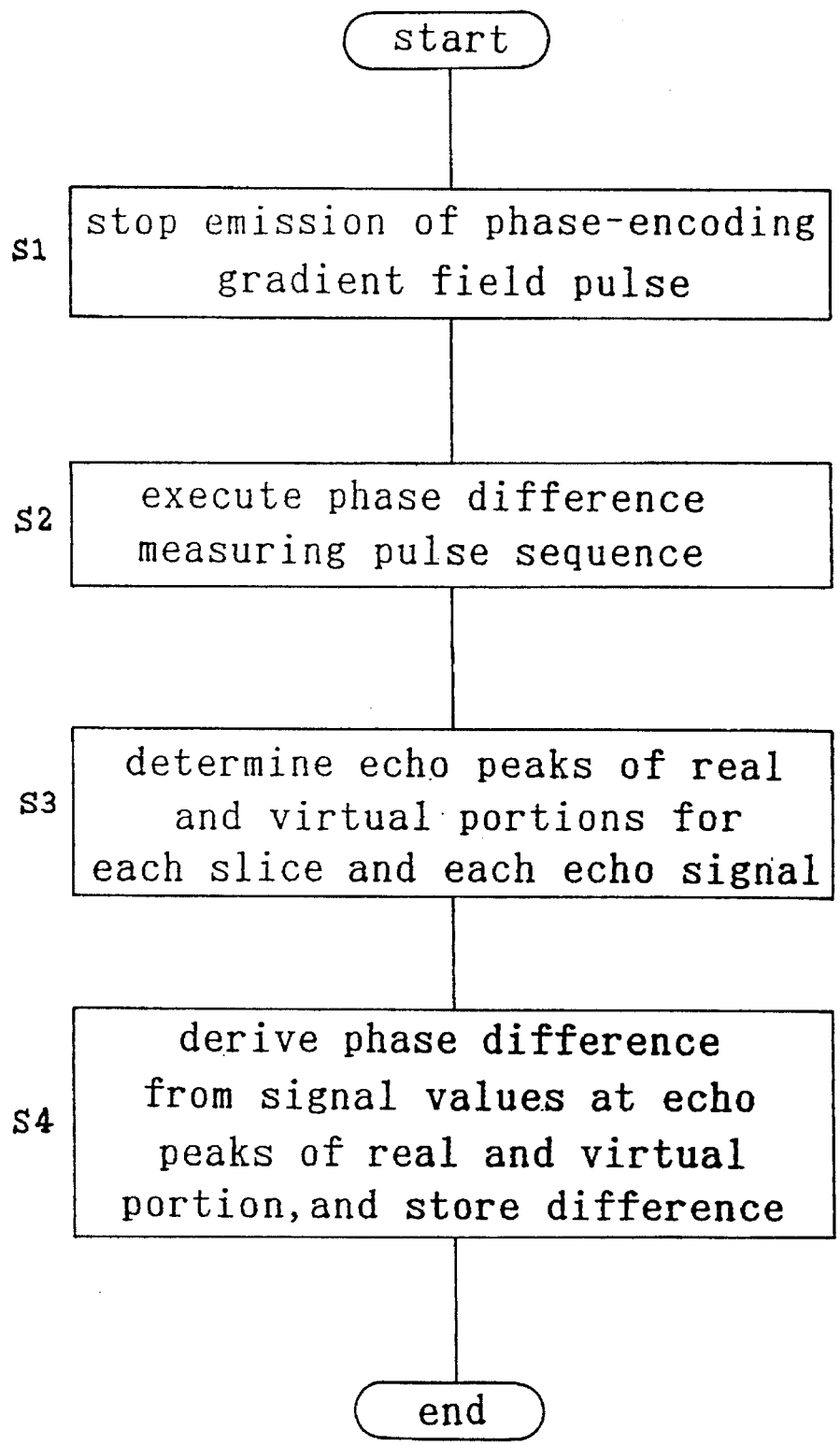
FIG. 6 is a flowchart showing a sequence of acquiring a phase difference from actually measured data.

In the first embodiment, phase difference φ is derived from equation (1) or equation (3). This may be derived from actual measurement data instead. A sequence of acquiring measurement data will be described with reference to the flowchart of FIG. 6.

At step S1, the gradient field coil 2y is stopped emitting the phase-encoding gradient field pulses.

At step S2, the pulse sequence shown in FIG. 2 is executed as a phase difference measuring pulse sequence (which may use CPMC pulse trains). This pulse sequence does not disturb magnetic fields applied for the respective signals since the phase-encoding gradient field pulses are suspended. Consequently, each echo signal has a greater signal strength than when the phase-encoding gradient field pulse is applied, and includes distinct echo peaks.

At step S3, echo peaks of real and virtual portions are determined for each slice and each echo signal.

At step S4, a phase difference φ is derived from the following equation (4) based on a signal value SR at the echo peak of the real portion and a signal value SI at the echo peak of the virtual portion determined at step S3:

$$\text{phase difference } \phi=\text{Tan}^{-1}(SI/SR) \quad (4)$$

The phase difference φ obtained for each slice and each echo signal is stored in the host computer 20.

Then, the pulse sequence shown in FIG. 2 is executed while applying the phase-encoding gradient field pulses, to pick up a sectional image. Next, the phase of each echo signal is subjected to a rotational amendment based on the phase difference φ derived from equation (4) and stored in the host computer 20 and the rotation matrix of equation (2). This process can obtain phase differences accurately since the phase differences include no computational error due to deviations from design values of carrier frequency $\omega_C$ and reference frequency $\omega_R$. Consequently, image blurring may be suppressed regardless of variations from apparatus to apparatus (in oscillation frequency of the RF signal generator 7).

This invention is applicable also to what is known as eccentric imaging in which sectional images are picked up with the reference frequency $\omega_R$ for the phase detector 10 deliberately offset by a predetermined amount. The raw data space is a space formed by phase encoding and frequency encoding (effected by the reading gradient field pulses). The position of zero frequency encoding amount corresponds to the central position of a reconstructed image. When the reference frequency $\omega_R$ is offset by a predetermined amount, the data in the raw data space corresponding to the central position of the reconstructed image shifts by the predetermined amount. The reconstructed image also moves accordingly. Thus, even when the position of an examinee in the MR imaging apparatus is not a desired position, the reconstructed image may be moved by offsetting the reference frequency $\omega_R$ by a predetermined amount without moving the examinee. On this occasion also, image blurring may be suppressed by effecting the above amendment of phase differences.

The present invention may be embodied in other specific forms without departing from the spirit or essential attributes thereof and, accordingly, reference should be made to the appended claims, rather than to the foregoing specification, as indicating the scope of the invention.

What is claimed is:

1. An MR imaging apparatus using NMR phenomenon, comprising:

a main magnet for generating a uniform static magnetic field in an imaging space;

a first, a second and a third gradient field coils for generating three types of gradient field pulses, said three types of gradient field pulses including slice-selecting gradient field pulses, phase-encoding gradient field pulses, and reading gradient field pulses, with magnetic strengths varying in three orthogonal directions in said imaging space;

a RF coil for emitting an excitation RF pulse and a plurality of refocus RF pulses and detecting echo signals;

RF emitting means for modulating, with a predetermined carrier frequency, and successively emitting said excitation RF pulse and said refocus RF pulses with predetermined timing through said RF coil, said RF emitting means emitting said refocus RF pulses while alternately switching a phase polarity thereof;

slice-selecting gradient field pulse generating means for generating said slice-selecting gradient field pulses through said first gradient field coil for selecting slice planes, in timed relationship with said excitation RF pulse and said refocus RF pulses;

phase-encoding gradient field pulse generating means for generating said phase-encoding gradient field pulses through said second gradient field coil in timed relationship with said echo signals, said phase-encoding gradient field pulses being varied for the respective echo signals;

reading gradient field pulse generating means for generating said reading gradient field pulses through said third gradient field coil in timed relationship with said echo signals;

data collecting means for detecting, with a predetermined frequency (reference frequency), said echo signals detected by said RF coil, and collecting data therefrom;

phase detecting means for determining phase differences of echo peaks in said echo signals with respect to said reference frequency, respectively;

rotating means for rotating said data collected from said echo signals based on said phase differences to connect phases of said echo signals to be continuous; and data processing means for reconstructing a sectional image based on said data rotated.

2. An apparatus as defined in claim 1, wherein said phase detecting means is operable to derive said phase differences from;

$$\phi=(\omega_C-\omega_R)k\cdot Tes+(1+(-1)^k)\pi/2\text{(rad)}$$

where k is a positive integer representing an echo signal number in order of emission, $\omega_C$ is said carrier frequency, $\omega_R$ is said reference frequency, and Tes is an echo interval.

3. An MR imaging apparatus using NMR phenomenon, comprising:

a main magnet for generating a uniform static magnetic field in an imaging space;

a first, a second and a third gradient field coils for generating three types of gradient field pulses, said three types of gradient field pulses including slice-selecting gradient field pulses, phase-encoding gradient field pulses, and reading gradient field pulses, with magnetic strengths varying in three orthogonal directions in said imaging space;

an RF coil for emitting an excitation RF pulse and a plurality of refocus RF pulses and detecting echo signals:

RF emitting means for modulating, with a predetermined carrier frequency, and successively emitting said excitation RF pulse and said refocus RF pulses with predetermined timing through said RF coil, said RF emitting means emitting said refocus RF pulses 90° out of phase with said excitation RF pulse without switching a phase polarity thereof;

slice-selecting gradient field pulse generating means for generating said slice-selecting gradient field pulses through said first gradient field coil for selecting slice planes in timed relationship with said excitation RF pulse and said refocus RF pulses;

phase-encoding gradient field pulse generating means for generating said phase-encoding gradient field pulses through said second gradient field coil in timed relationship with said echo signals, said phase-encoding gradient field pulses being varied for the respective echo signals;

reading gradient field pulse generating means for generating said reading gradient field pulses through said third gradient field coil in timed relationship with said echo signals;

data collecting means for detecting, with a predetermined frequency (reference frequency), said echo signals detected by said RF coil, and collecting data therefrom;

phase detecting means for determining phase differences of echo peaks in said echo signals with respect to said reference frequency, respectively;

rotating means for rotating said data collected from said echo signals based on said phase differences to connect phases of said echo signals to be continuous; and data processing means for reconstructing a sectional image based on said data rotated.

4. An apparatus as defined in claim 3, wherein said phase detecting means is operable to derive said phase differences from:

$$\phi=(\omega_C-\omega_R)k \cdot Tes \text{(rad)}$$

where k is a positive integer representing an echo signal number in order of emission, $\omega_C$ is said carrier frequency, $\omega_R$ is said reference frequency, and Tes is an echo interval.

5. An apparatus as defined in claim 1, wherein said phase detecting means is operable to stop said phase-encoding gradient field pulse generating means prior to photographing of said sectional image, thereafter to execute a phase difference measuring pulse sequence corresponding to a photographing pulse sequence, and to measure said phase differences of said echo peaks in said echo signals with respect to said reference frequency, respectively.

6. An apparatus as defined in claim 1, wherein said RF emitting means is operable to control emission timing of an "n"th refocus RF pulse ("n" being a positive integer) to establish;

$$\{2(n-1)+1\}\tau$$

where emission of said excitation RF pulse is regarded as time origin, and $\tau$ is a point of time at which a first one of said refocus RF pulses is emitted.

7. An apparatus as defined in claim 1, wherein said phase-encoding gradient field pulse generating means is operable to generate rewinding pulses symmetric to said phase-encoding gradient field pulses about centers of said echo signals, respectively, and having the same strength and pulse width as and an opposite polarity to said phase-encoding gradient field pulses.

8. An apparatus as defined in claim 1, wherein said data collecting means is operable to collect said data by detecting said echo signals with a predetermined amount offset from said reference frequency.

9. An apparatus as defined in claim 3, wherein said phase detecting means is operable to stop said phase-encoding gradient field pulse generating means prior to photographing of said sectional image, thereafter to execute a phase difference measuring pulse sequence corresponding to a photographing pulse sequence, and to measure said phase differences of said echo peaks in said echo signals with respect to said reference frequency, respectively.

10. An apparatus as defined in claim 3, wherein said RF emitting means is operable to control emission timing of an "n"th refocus RF pulse ("n"th being a positive integer) to establish;

$$\{2(n-1)+1\}\tau$$

where emission of said excitation RF pulse is regarded as time origin, and $\tau$ is a point of time at which a first one of said refocus RF pulses is emitted.

11. An apparatus as defined in claim 3, wherein said phase-encoding gradient field pulse generating means is operable to generate rewinding pulses symmetric to said phase-encoding gradient field pulses about centers of said echo signals, respectively, and having the same strength and pulse width as and an opposite polarity to said phase-encoding gradient field pulses.

12. An apparatus as defined in claim 3, wherein said data collecting means is operable to collect said data by detecting said echo signals with a predetermined amount offset from said reference frequency.

* * * * *